(12) United States Patent
Ito

(10) Patent No.: US 6,600,879 B2
(45) Date of Patent: Jul. 29, 2003

(54) CAMERA WITH ELECTRONIC FLASH DEVICE

(75) Inventor: Toru Ito, Saitama (JP)

(73) Assignee: Fuji Photo Optical Co., Ltd., Saitama (JP)

( * ) Notice: Subject to any disclaimer, the term of this patent is extended or adjusted under 35 U.S.C. 154(b) by 0 days.

(21) Appl. No.: 10/173,801

(22) Filed: Jun. 19, 2002

(65) Prior Publication Data

US 2003/0002872 A1 Jan. 2, 2003

(30) Foreign Application Priority Data

Jun. 29, 2001 (JP) ........................................ 2001-199853

(51) Int. Cl.[7] ............................................. G03B 15/05
(52) U.S. Cl. ....................................... 396/176; 396/206
(58) Field of Search ................................. 396/205, 206, 396/155, 176

(56) References Cited

U.S. PATENT DOCUMENTS

| 3,383,994 | A | * | 5/1968 | Bihlmaier | 396/206 |
| 3,577,899 | A | * | 5/1971 | Ikegami | 396/205 |
| 6,160,958 | A | * | 12/2000 | Manico et al. | 396/176 X |
| 6,360,060 | B1 | * | 3/2002 | Tsuchida | 396/176 |
| 6,516,144 | B2 | * | 2/2003 | Imamura et al. | 396/205 |

* cited by examiner

Primary Examiner—W. B. Perkey
(74) Attorney, Agent, or Firm—Young & Thompson

(57) ABSTRACT

A camera with an electronic flash device has a main capacitor mounted on a flash circuit board with striding over a circuit part. The main capacitor has a capacitor body and a pair of terminals protruding from a bottom face of the capacitor body. The terminals are soldered onto the flash circuit board with securing a space for arrangement of the circuit part between the bottom face of the capacitor body and the flash circuit board. Miniaturization of the flash circuit board becomes possible. Inside a main body of the camera, a battery and the main capacitor are arranged vertically and adjacently each other along a parallel direction with an optical axis of a taking lens, in order to make the camera compact.

6 Claims, 3 Drawing Sheets

CAMERA WITH ELECTRONIC FLASH DEVICE

BACKGROUND OF THE INVENTION

1. Field of the Invention

The present invention relates to a camera with an electronic flash device.

2. Background Arts

Almost all cameras, such as a compact camera, an instant camera, and the like, have an electronic flash device by which it is possible to photograph in a dark place, like at night and inside a room. The electronic flash device has flash circuit parts, for example a flash circuit board with a main capacitor. Furthermore, on some flash circuit boards, circuit parts other than the flash circuit parts, such as a capacitor as a power source to back up the cameras, are mounted too. In the case, as the circuit parts are mounted on one flash circuit board together with the flash circuit parts, it is possible to reduce a number of circuit boards and then costs of the cameras.

However, because of mounting the circuit parts on the flash circuit board together with the flash circuit parts, it is necessary to enlarge a size of the flash circuit board to secure a space for these circuit parts. But a larger flash circuit board causes a larger-sized camera. Also, there is a problem that enlargement of the flash circuit board has adverse effect on reduction of the costs, which is brought by mounting the circuit parts on the one flash circuit board together with the flash circuit parts.

SUMMARY OF THE INVENTION

In view of the foregoing, a main object of the present invention is to provide a camera with a small-sized flash circuit board.

Another object of the present invention is to provide a camera that makes it possible to reduce costs and size.

To achieve the above objects, in a camera according to the present invention, a main capacitor is mounted on a flash circuit board with striding over a circuit part. The main capacitor, which supplies electronic energy to a flash discharge tube, has a cylindrical capacitor body and a pair of terminals protruding from a bottom face of the capacitor body. These terminals are soldered onto the flash circuit board with securing a space for arrangement of the circuit part between the bottom face of the capacitor body and the flash circuit board.

In the preferred embodiment of the present invention, a battery for supplying power to an electronic flash device, a shutter device, and the like are contained in a main body. Inside the main body, each of the battery and the capacitor is arranged vertically, and also adjacently each other along a parallel direction with an optical axis of a taking lens.

According to the present invention, because the circuit part is disposed between the terminals of the main capacitor, it is possible to miniaturize a size of the flash circuit board, and then a size of the camera.

BRIEF DESCRIPTION OF THE DRAWINGS

The above objects and advantages of the present invention will become apparent from the following detailed description of a preferred embodiment when read in association with the accompanying drawings, which are given by way of illustration only and thus are not limiting the present invention. In the drawings, reference numerals designate corresponding parts throughout the several views, and wherein.

DETAILED DESCRIPTION OF THE PREFERRED EMBODIMENTS

Figure 1:
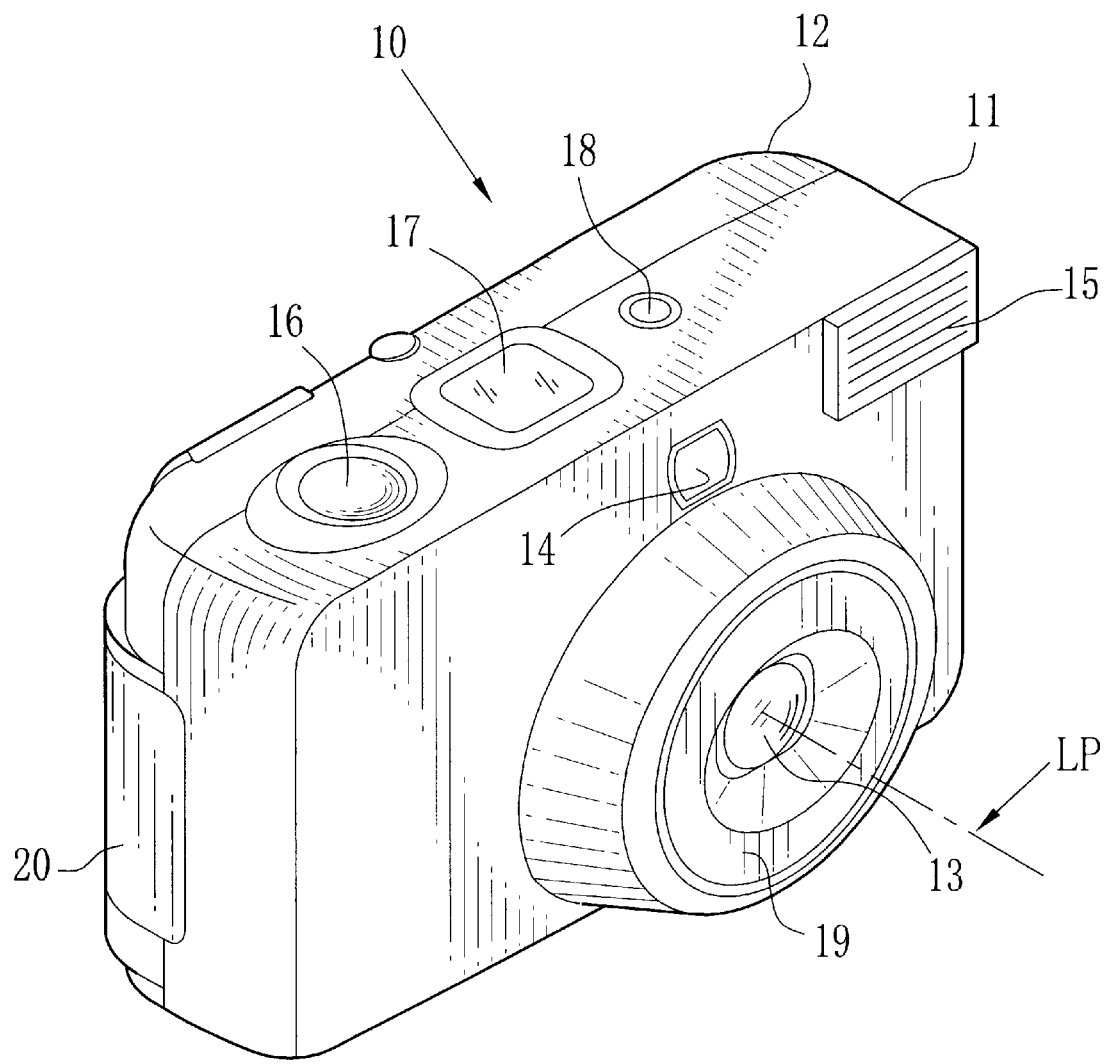
FIG. 1 is a front perspective view of a camera with an electronic flash device according to the present invention.
Figure 2:
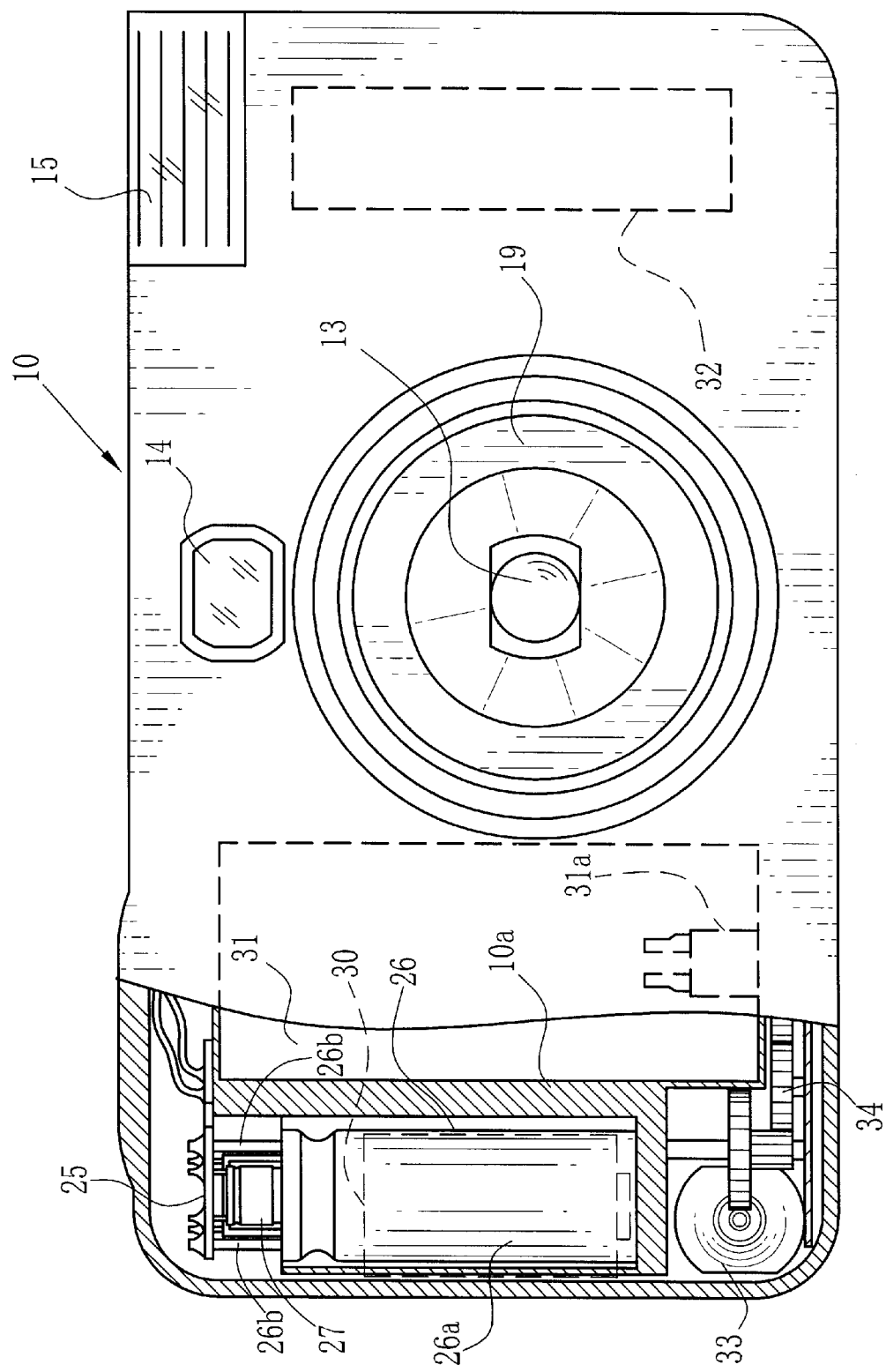
FIG. 2 is a front elevation, partly in section to show a position of a flash circuit board.

As shown in FIG. 1, a camera 10 has a front cover 11, a rear cover 12, and a main body 10a (refer to FIG. 2). In a front wall of the camera 10, a taking lens 13, a viewfinder 14, and a flash projector 15 are provided. In a top wall of the camera 10, a shutter button 16, a liquid crystal display 17, and a date setting button 18 are provided. The taking lens 13 is contained in a lens barrel 19. The lens barrel 19 is provided movably in a direction of an optical axis LP of the taking lens 13, and movement of the lens barrel 19 changes a focal length of the taking lens 13.

The date setting button 18 is operated to set a date and the like, and the liquid crystal display 17 shows the date. The camera 10 has a date imprinting device, which is not illustrated. The date imprinting device records the date shown in the liquid crystal display 17 on a photographic film. The liquid crystal display 17 shows various photography data, besides data set by the date setting button 18. In a sidewall of the camera 10, is provided a lid 20 through which a battery chamber 29 (refer to FIG. 3) is opened and closed.

Figure 3:
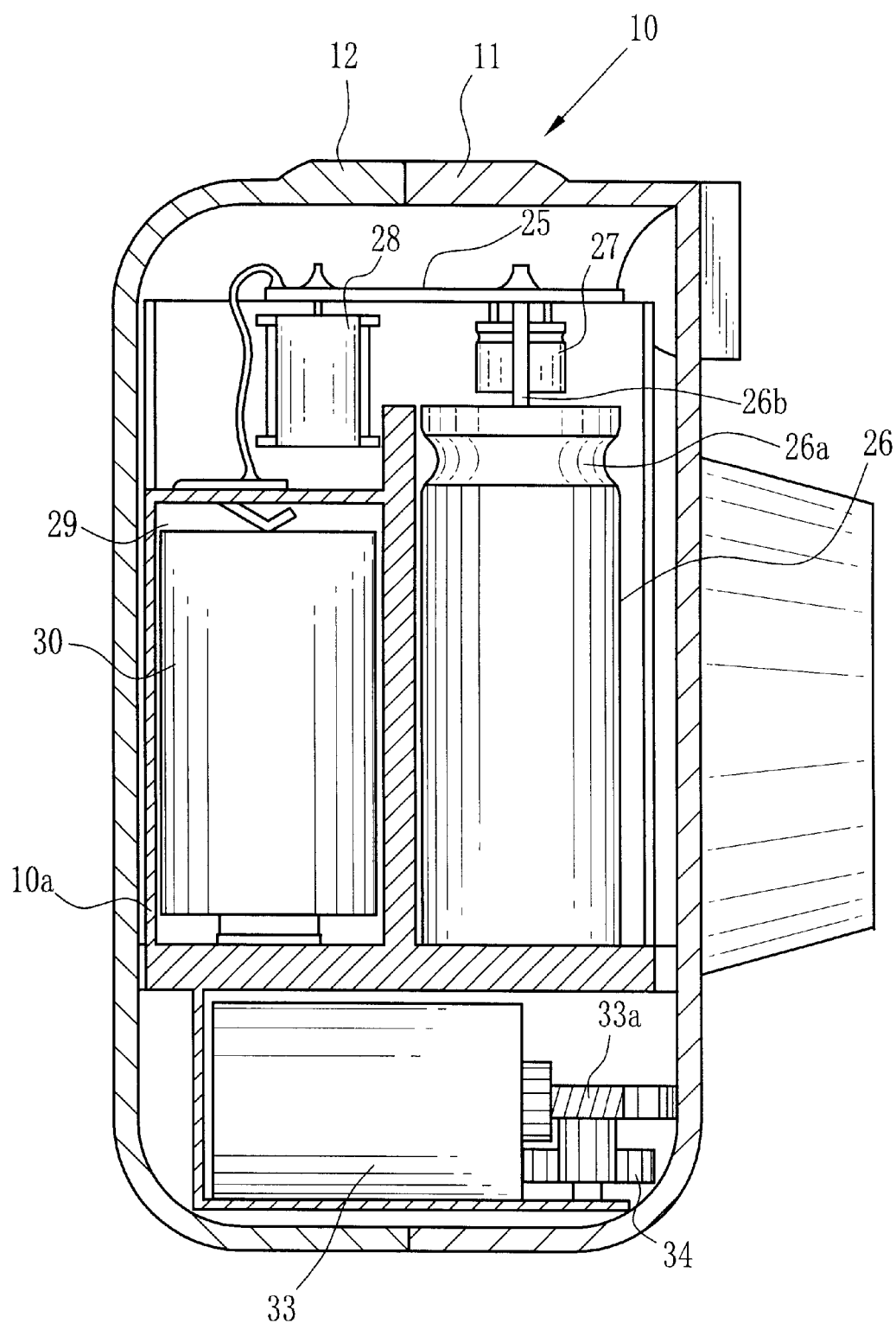
FIG. 3 is a longitudinal sectional view to show positions of a circuit part mounted on the flash circuit board and a battery.

As illustrated in FIG. 2 and FIG. 3, a photography mechanism, a flash circuit board 25, and the like are installed on the main body 10a, and covered with the front cover 11 and the rear cover 12. The flash circuit board 25 is disposed beside a magazine chamber 31 with a mounting side of a circuit part facing downwards, and connected to the flash projector 15, the date imprinting mechanism, and the like by leading wires and flexible boards. Circuit patterns are printed on the flash circuit board 25. Onto the flash circuit board 25, each circuit part like a main capacitor 26, a backup capacitor 27, and a transformer 28 is soldered.

The main capacitor 26 consists of a cylindrical capacitor body 26a and a pair of terminals 26b. The terminals 26b protrude from a bottom face of the capacitor body 26a. Ends of the terminals 26b are inserted into through-holes in the flash circuit board 25 and soldered onto a rear side of the flash circuit board 25. When the ends are soldered onto the flash circuit board 25, the terminals 26b have a length that secures a space between the flash circuit board 25 and the bottom face of the capacitor body 26a.

The backup capacitor 27 is mounted on the flash circuit board 25, whereon the backup capacitor 27 is disposed in the space between the flash circuit board 25 and the bottom face of the capacitor body 26a. The backup capacitor 27 is used for a temporary power source of the camera 10, when a battery 30 is extracted for exchange, for example. Thus, even if the battery 30 is extracted, the camera 10 can hold the date, the photography data, and the like for a certain time. The transformer 28 is disposed above the battery chamber 29.

As described above, because the backup capacitor 27 is mounted in the space between the flash circuit board 25 and the capacitor body 26a, it becomes possible to miniaturize the flash circuit board 25, as compared with a case where the backup capacitor 27 is mounted on the other position in the flash circuit board 25. Therefore, it becomes possible to reduce costs of the flash circuit board 25, and then costs of the camera 10. Also, because the miniaturization of the flash circuit board 25 increases flexibility in disposing parts of the camera 10, it is possible to miniaturize the camera 10.

In the rear side of the main body 10a, is provided the battery chamber 29 in which the battery 30 for a power source of the camera 10 is loaded. The capacitor body 26a is fitted onto a front side of the main body 10a. The battery 30 and the capacitor body 26a are arranged adjacently each other along the direction of the optical axis LP of the taking lens 13, with each lengthwise direction of the battery 30 and the capacitor body 26a being vertical inside the main body 10a. Thus, it is possible to make efficient use of space in front of the battery chamber 29 in the camera body 10a. The capacitor body 26 stores electrical charge, which is from the battery 30 and has risen by a transformer 28, and discharges the electrical charge to a discharge tube of the flash projector 15 in emitting a flash.

A magazine chamber 31 is provided by the side of the capacitor body 26a, and loaded with a 135 type film magazine. Inside the magazine chamber 31, is provided a drive fork 31a, which drives a magazine spool in the film magazine. A film take-up chamber (not illustrated) is provided on the right side in the camera 10. Inside the film take-up chamber, is provided a take-up spool 32, which winds the photo film. To arrange the battery 30 and the capacitor body 26a of which lengthwise directions are in parallel with the take-up spool 32, makes the camera 10 miniaturized. Inside the take-up spool 32 a film feed motor is contained. Rotation of the film feed motor is transmitted to the drive fork 31a and the take-up spool 32, via a gear train (not-illustrated) arranged in an underside of the camera body 10a, so that the photo film is fed. In a space under the capacitor body 26a and the battery 30, a motor 33 for driving the taking lens is disposed. Rotation of a drive shaft 33a of the motor 33 is transmitted to a gear for driving the lens barrel 19, via a gear train 34 in the underside of the main body 10a, so that the lens barrel 19 moves.

In the above embodiment, the backup capacitor 27 is disposed in the space between the flash circuit board 25 and the capacitor body 26a, but other circuit parts may be disposed in the space appropriately. Also the flash circuit board 25 may be disposed in an appropriate position.

The present invention has been described in a case where the camera uses the 135-type photo film. But the present invention is also applicable in cases of using a digital camera, a camera with an IX-240 type photo film, and a lens fitted photo film unit, for example.

The present invention is not to be limited to the above embodiment but, on the contrary, various modifications will be possible to those skilled in the art without departing from the scope of claims appended hereto.

What is claimed is:

1. A camera with an electronic flash device comprising:
   a flash circuit board constituting said electronic flash device;
   a main capacitor having a capacitor body for storing electronic charge and a pair of terminals protruding from a bottom face of said capacitor body, said a pair of terminals being soldered onto said flash circuit board with securing a space between said flash circuit board and said bottom face of said capacitor body; and
   a circuit part positioned in said space between said flash circuit board and said bottom face of said capacitor body, and attached onto said flash circuit board.

2. A camera as recited in claim 1, wherein said a pair of terminals penetrate said flash circuit board, and then are soldered onto a rear side of said flash circuit board.

3. A camera as recited in claim 2, wherein said main capacitor is vertically disposed inside said camera.

4. A camera as recited in claim 3, further comprising:
   a battery which is disposed parallel with and adjacently to said main capacitor.

5. A camera as recited in claim 4, wherein said capacitor body and said battery are disposed adjacently each other along a parallel direction with an optical axis of a taking lens.

6. A camera as recited in claim 5, further comprising:
   a take-up spool for winding a photo film, wherein a lengthwise direction of said capacitor body is disposed in parallel with an axial direction of said take-up spool.

* * * * *